(12) United States Patent
Izawa et al.

(10) Patent No.: US 6,573,190 B1
(45) Date of Patent: Jun. 3, 2003

(54) DRY ETCHING DEVICE AND DRY ETCHING METHOD

(75) Inventors: Masaru Izawa, Hino (JP); Shinichi Tachi, Sayama (JP); Kenetsu Yokogawa, Tsurugashima (JP); Nobuyuki Negishi, Kokubunji (JP); Naoyuki Kofuji, Tama (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/856,264

(22) PCT Filed: Nov. 22, 1999

(86) PCT No.: PCT/JP99/06511

§ 371 (c)(1),
(2), (4) Date: May 18, 2001

(87) PCT Pub. No.: WO00/31787

PCT Pub. Date: Jun. 2, 2000

(30) Foreign Application Priority Data

Nov. 26, 1998 (JP) .............................. 10-335262

(51) Int. Cl.⁷ .............................................. H01L 21/00
(52) U.S. Cl. ............. 438/728; 156/345.42; 156/345.46; 156/345.48; 216/67; 216/69; 216/70; 438/729; 438/732

(58) Field of Search ........................ 156/345.29, 345.36, 156/345.42, 345.46, 345.48; 438/726, 728, 729, 732; 216/67, 69, 70

(56) References Cited

U.S. PATENT DOCUMENTS 5,891,252 A * 4/1999 Yokogawa et al. ... 118/723 AN
6,027,603 A * 2/2000 Holland .................. 156/345.48
6,245,202 B1 * 6/2001 Edamura et al. .... 156/345.48 X

FOREIGN PATENT DOCUMENTS

EP      0793254       * 9/1997
JP      02-051228     * 2/1990
JP      04-346225     * 12/1992

* cited by examiner

Primary Examiner—William A. Powell
(74) Attorney, Agent, or Firm—Antonelli, Terry, Stout & Kraus, LLP

(57) ABSTRACT

A dry etching apparatus and method which can uniformly and stably generate a high-density plasma over a wide range, and can cope with increase of wafer diameter and making the pattern finer in etch processing of the fine pattern of a semiconductor device. The apparatus and method enables a magnitude of a magnetic field to be cyclically modulated when a substrate to be treated is etch processed. The cyclical modulation may be effected by cyclically modulating a coil current flowing to a solenoid coil.

12 Claims, 6 Drawing Sheets

DRY ETCHING DEVICE AND DRY ETCHING METHOD

BACKGROUND OF THE INVENTION

1. Field of the Invention

The present invention relates to a plasma generating apparatus for use in micromachining a semiconductor device and a dry etching method for realizing high precision dry etching processing for fine electrodes, wiring and contact holes on the semiconductor device.

2. Description of the Related Prior Arts

In a semiconductor device manufacturing process, a thin film such as polycrystalline silicon (Poly-Si) or Al—Cu alloy formed on a wafer is micromachined by dry etching to form gate electrodes or metal wiring. For electrical connection between a transistor and a metal wiring, and between metal wirings, formed on the wafer, a contact hole is formed by a dry etching method on an insulating film (a thin film consisting mainly of $SiO_2$ or the like, which will be hereinafter referred to as an oxide film) formed on the transistor construction and between the wirings, so that an electrical conductor is filled in the contact hole.

The above-mentioned dry etching processing is done in such a manner that an etching gas is introduced into a dry etching apparatus as a vacuum chamber, a high frequency bias or microwave ($\mu$wave) is applied to the etching gas to generate plasma, and radicals and ions generated in the plasma are used.

In etching, a mask such as a photoresist thin film provided by transferring an electrode pattern, wiring pattern or hole pattern is formed on the oxide film. In dry etching, the Poly-Si film, Al—Cu alloy film or oxide film is selectively processed to the mask or substrate to form a predetermined processing shape.

In recent years, in order to improve the integration density, ability to be treated and productivity of a semiconductor device, making the pattern finer, and increase of the diameter of a wafer to be treated (300 mm in diameter) have been advanced. To cope with increase of the wafer diameter, a plasma generated in a dry etching apparatus must be uniform. To enhance the productivity, the plasma density must be increased to $10^{11}/cm^3$ or higher. To improve the controllability of the processing shape, a stable plasma must be formed at a gas pressure in a range from 0.2 Pa to 4 Pa. For this reason, the wafer diameter must be large and a plasma which is uniform and has a high density must be generated at a low gas pressure.

In a conventional parallel plate type (capacitive coupled type) dry etching apparatus, however, it is hard to lower the gas pressure. In addition, in a conventional inductive coupled type dry etching apparatus, to obtain a plasma having high uniformity with a large wafer diameter, the distance between the plasma generating source and the wafer must be large, thus it is difficult to increase the density. Further, in a conventional magnetic microwave etching apparatus, the microwave has a short wavelength of about 120 mm, and the microwave node is applied onto the wafer. Thus, it is difficult to realize a uniform plasma with a large wafer diameter.

In the magnetic microwave etching apparatus, a uniform plasma can be obtained by increasing the wavelength of the microwave. The frequency of a high frequency introduced to generate a plasma is changed from a microwave (2.45 GHz) to UHF band (300 MHz to 900 MHz), so that the wavelength of the high frequency introduced is 300 mm or more. There is a possibility of the provision of a uniform plasma which can cope with etching of a large-diameter wafer. In other words, the magnetic UHF etching apparatus may cope with the process for manufacturing a fine semiconductor device of large diameter. The above-mentioned magnetic UHF etching apparatus is disclosed in, for example, U.S. Pat. No. 5,891,252 specification (the cited document 1).

In the above-mentioned magnetic UHF etching apparatus, a disc type antenna is used as means for introducing a UHF wave into a processing chamber. The diameter of the antenna and the thickness of the dielectric are determined such that a UHF wave can efficiently be introduced into the processing chamber, and so as to be resonant with the UHF wave introduced. The uniformity of the plasma generated depends on the diameter of the antenna, the magnetic field conditions (specifically, an electric current flowing to a solenoidal coil) and the gas pressure. Since the range of the magnetic field conditions (coil current) for providing a uniform plasma is small, it is hard to obtain sufficient uniformity when the gas pressure or the UHF power inputted is changed. Further, optimum magnetic field conditions may be different for each apparatus, and the uniformity may be changed by the etching processing time. In particular, this tendency is high under the conditions of the high plasma density (the electronic density is $10^{11}$ pieces/$cm^3$ or higher).

In the magnetic UHF etching apparatus, when the equal magnetic field plane in the etching apparatus is of extremely concave type, the ion current density is higher in the center of the wafer than in the peripheral portion of the wafer. In other words, the plasma density is high in the vicinity of the center of the apparatus. When the equal magnetic filed plane is flat to the surface of the antenna, the ion current density is lower in the center portion of the wafer than in the peripheral portion thereof.

A uniform ion current density can be obtained when the coil current is controlled between the magnetic field conditions for providing an ion current density having a concave distribution (which is high in the peripheral portion) and the magnetic field conditions having a convex distribution (which is high in the center portion). Unless the coil current is controlled with an accuracy of about ±0.05A, sufficient uniformity is hard to obtain. In other words, the margin of the coil current is small. Thus, it is difficult to obtain sufficient uniformity.

SUMMARY OF THE INVENTION

Accordingly, an object of the present invention is to provide a magnetic UHF etching apparatus improved so as to solve the foregoing problems in the conventional magnetic UHF etching apparatus, more specifically, to provide a magnetic UHF etching apparatus in which a plasma generated is uniform and stable, a plasma having a plasma density of $10^{11}/cm^3$ or higher can be generated, and can etch process a Poly-Si film, Al—Cu alloy film or an oxide film uniformly over the entire surface of a wafer having a diameter of 300 mm or larger.

In order to achieve the foregoing object, the present invention provides a dry etching apparatus comprising means for introducing at least one processing gas into a vacuum processing chamber, exhausting means for exhausting the processing gas to the outside of the vacuum processing chamber, a plate antenna capable of applying a high frequency voltage to the upper portion in the vacuum processing chamber and a plurality of solenoidal coils disposed outside of the vacuum processing chamber, wherein a plasma is generated in the vacuum processing chamber, and the plasma generated is used to etch process a substrate to be treated placed in the vacuum processing chamber, further comprising modulator for coil current for cyclically modulating a coil current flowing to the solenoidal coil.

In the above-mentioned dry etching apparatus according to the present invention, the modulation cycle of the coil current of the modulator for coil current is desirably set to 10 seconds or below.

The above-mentioned dry etching apparatus according to the present invention further includes, instead of the modulator for coil current, coil position control means for repeatedly changing the upward and downward positions (the axial position) of at least one solenoidal coil of the plurality of solenoidal coils.

In the above-mentioned dry etching apparatus according to the present invention, the frequency of the high frequency voltage applied to the plate antenna is desirably set in a range from 300 MHz to 900 MHz.

The present invention provides a dry etching method comprising using a dry etching apparatus including a vacuum processing chamber, vacuum exhausting means for vacuum exhaustion in the vacuum processing chamber, gas introducing means for introducing a gas for etch processing into the vacuum processing chamber, plasma generating generating means for forming the introduced gas in plasma in the vacuum processing chamber, and magnetic field applying means for applying magnetic field into the vacuum processing chamber, and etch processing a substrate to be treated placed in the vacuum processing chamber, wherein the magnitude of the magnetic field applied by the magnetic field applying means is modulated cyclically when the substrate to be treated is etch processed.

In the above-mentioned dry etching method according to the present invention, the cycle of the cyclic modulation of the magnitude of the magnetic field applied by the magnetic field applying means is desirably set to 10 seconds or below.

In the above-mentioned magnetic UHF etching apparatus, the concave distribution to the convex distribution of the ion current density in the plasma generated can be controlled by the coil current flowing to the solenoidal coil. The plasma generated has good stability in the concave or convex distribution, whereby the uniformity of the ion current density is not changed greatly by the gas pressure or the UHF wave introduction power. Thus, when the ion current densities in the concave and convex distributions are added, there is a possibility of the provision of a uniform ion current density distribution. Specifically, a plasma having a concave ion current density distribution and a plasma having a convex ion current density distribution are generated alternately, thereby giving a uniform ion current density distribution.

In the above-mentioned magnetic UHF etching apparatus, the plasma density, more specifically, the ion density radiated onto a wafer (the ion current density) is determined by an outer product (E×B) obtained by multiplying a magnetic field B applied by means of the solenoidal coil by an electrical field E of the UHF wave. When the frequency of the UHF wave is 450 MHz, the magnetic field B of 160 to 170 gausses and the electrical field E so as to generate an Electron Cyclotron Resonance (ECR) under the magnetic field B are applied to give a high plasma density.

In the magnetic UHF etching apparatus shown in FIG. 1, a magnetic field vector B of the solenoidal coil is in the vertical direction, so that only the horizontal component of the electrical field E of the UHF wave is resonant with the magnetic field B. Due to the construction of an antenna used, the horizontal electrical field component is strong in the peripheral portion of the antenna, as indicated by curve 201 of FIG. 2. When an equal magnetic field plane of 160 to 170 gausses is formed by a coil in parallel with a uniform magnetic field, that is, a wafer top surface and antenna lower surface 301 (straight line 302 of FIG. 3), ECR resonance is strong in the peripheral portion of the wafer. For example, the ion current density distribution on a silicon wafer having a diameter of 300 mm is a concave distribution in which the ion current density is higher in the peripheral portion of the wafer than in the center portion of the wafer, as indicated by curve 401 of FIG. 4.

The electric current of the solenoidal coil is adjusted so that the equal magnetic field plane of 160 to 170 gausses is closer to the wafer surface in the vicinity of the center portion of the wafer (0 mm position) and is moved away from the wafer surface in the peripheral portion (−150 mm position and +150 mm position), as indicated by curve 303 of FIG. 3. In this case, the resonance point in the peripheral portion of the wafer as compared with the center portion of the wafer is moved away from the wafer surface. The ion current density is almost uniform over the entire surface of the wafer, as shown by curve 402 of FIG. 4.

When the equal magnetic field plane of the applied magnetic field in the peripheral portion of the wafer is further moved away from the wafer surface (curve 304 of FIG. 3), the ECR resonance is weaker in the peripheral portion of the wafer. The ion current density distribution is a convex distribution, as indicated by curve 403 of FIG. 4.

The concave distribution of the ion current density can be obtained under the magnetic field conditions in which the equal magnetic field plane is flat, and the convex distribution can be obtained under the magnetic field conditions in which the equal magnetic field plane is concave-shaped. The uniform ion current density can be realized by making fine adjustment of the coil current, by switching (modulating) the coil current values in etching, or by adding the concave and convex distributions of the ion current density. Further, a uniform ion current density distribution as described above can be obtained by changing the height of the solenoidal coil for generating a magnetic field (the upward and downward installation position), instead of using the coil current modulation. Furthermore, the coil current modulation may be employed together with the solenoidal coil position adjustment.

As another method for making an ion current density (plasma density) uniform, when a plurality of (two ore more) coils are used as the magnetic field applying means, at least one coil of the plurality of coils is moved alternately between a position for providing the concave-shaped ion current density distribution and a position for providing the convex-shaped ion current density distribution, and then the concave-shaped ion current density distribution and the convex-shaped ion current density distribution are added.

Other objects and constructions of the present invention and operation and effects obtained therewith will be apparent sequentially in the detailed description by giving the following examples.

DESCRIPTION OF THE PREFERRED EMBODIMENTS

Embodiments of the present invention will be described in detail hereinbelow by giving examples with reference to the drawings.

EXAMPLE 1

Figure 1:
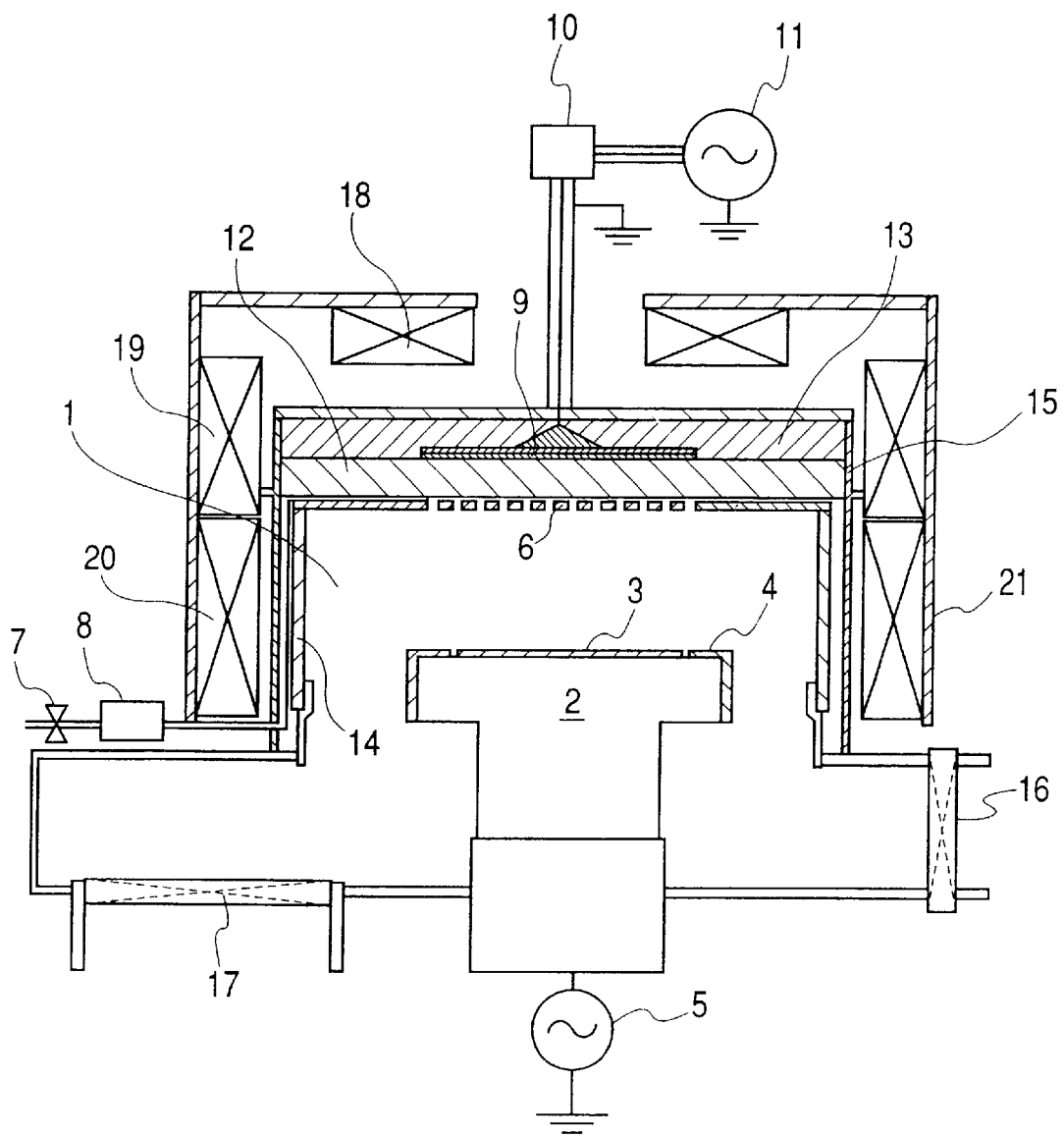
FIG. 1 is a longitudinal sectional schematic view showing the general construction of a dry etching apparatus of one example of the present invention.
Figure 2:
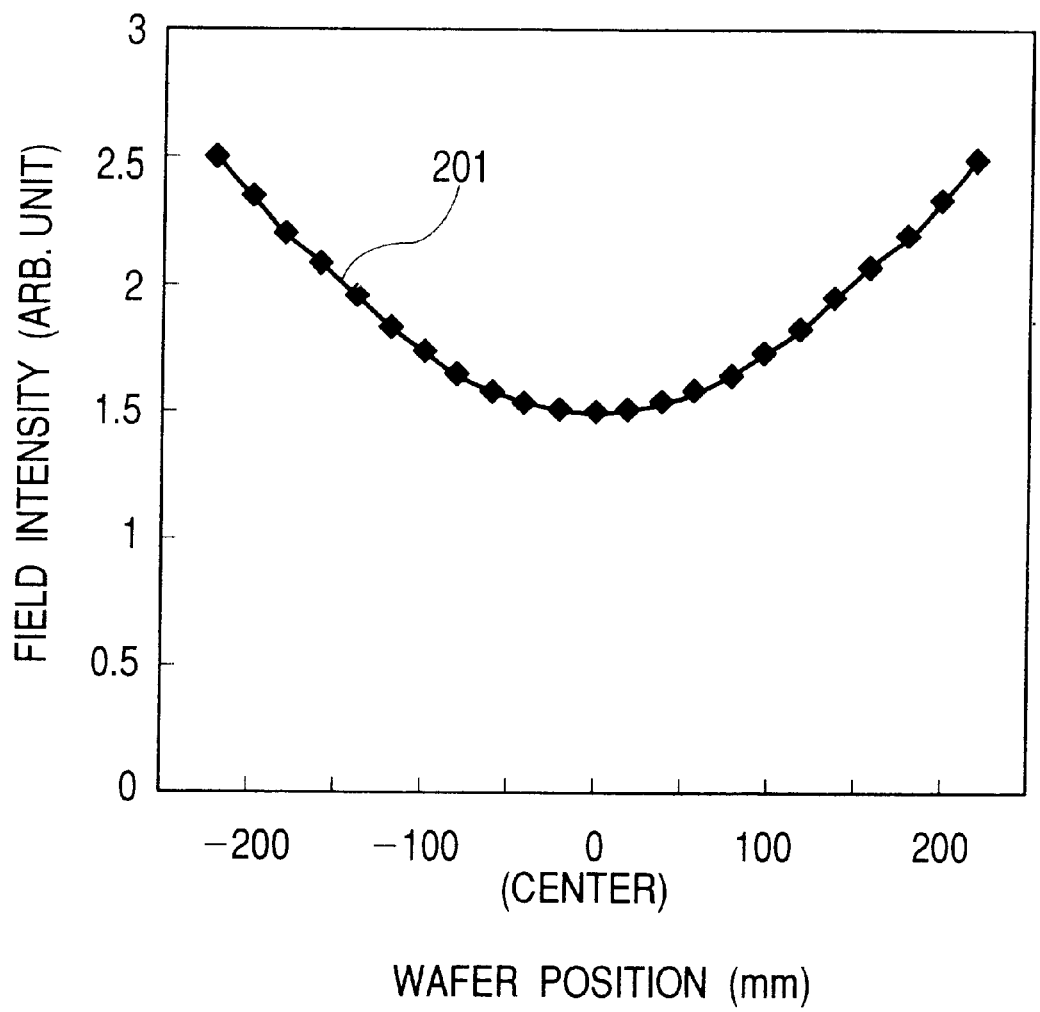
FIG. 2 is a curve view showing an electrolytic intensity distribution in the apparatus shown in FIG. 1 in the horizontal plane 10 mm under an antenna.
Figure 3:
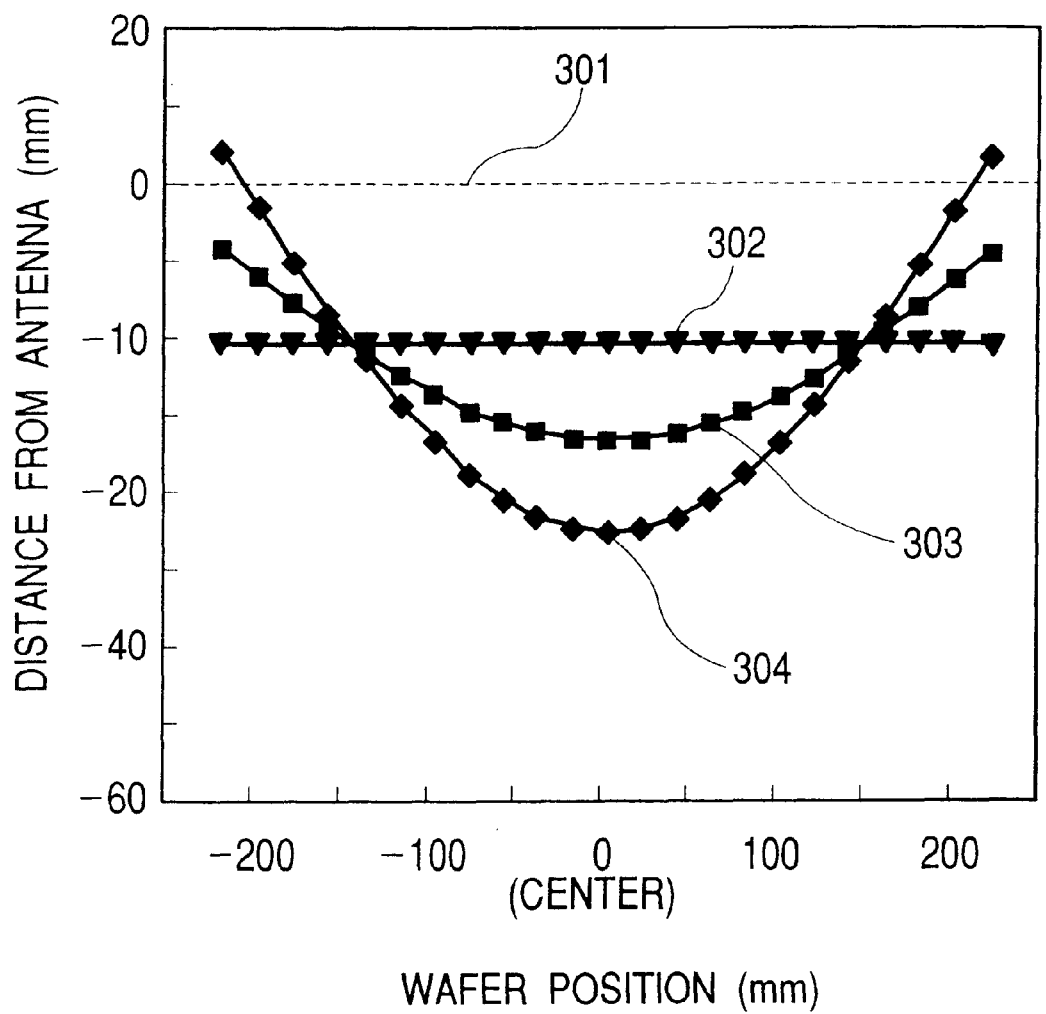
FIG. 3 is a curve view of assistance in explaining a state of an equal magnetic field plane changed by the coil current modulation in the apparatus shown in FIG. 1.
Figure 4:
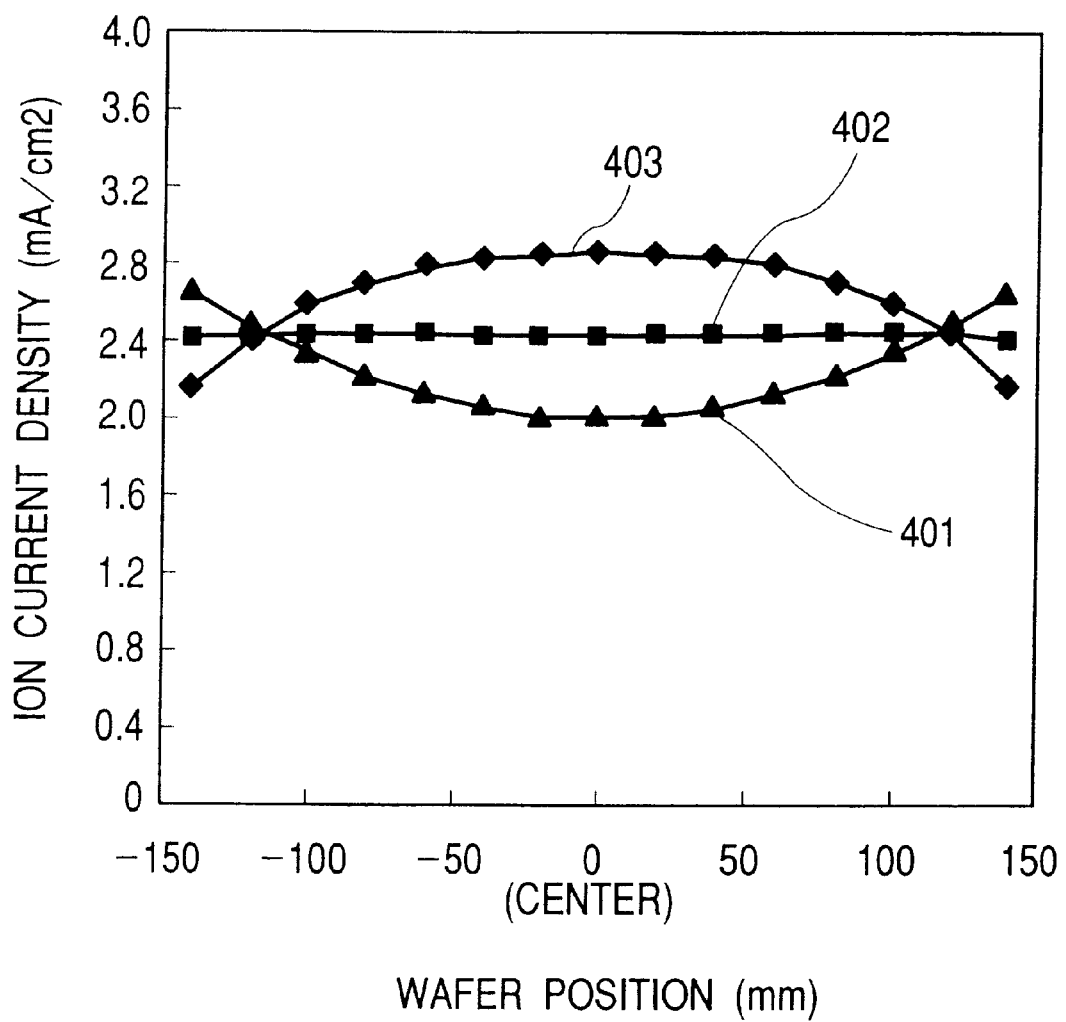
FIG. 4 is a curve view of assistance in explaining a state of change of the ion current density distribution of a plasma generated in the apparatus shown in FIG. 1 corresponding to the change of the equal magnetic field shown in FIG. 3.

FIG. 1 shows the general construction of a dry etching apparatus of one embodiment of the present invention. In the apparatus of this example, an etching gas is introduced into an etching processing chamber 1 from a shower plate 6, a UHF wave power source 11 generates a UHF wave of 200 MHz to 1.2 GHz which is then propagated to a metal antenna 9. Thereafter, the UHF wave is supplied from the antenna through a dielectric 12 to the etching processing chamber 1, thereby generating a plasma of the gas introduced.

A plurality of (three in the figure) solenoidal coils 18, 19 and 20 for generating a magnetic field are disposed on the outer circumference of the etching processing chamber 1. The coil current flowing to the solenoidal coils is controlled so that the solenoidal coils apply a magnetic field having a magnetic field magnitude in a range from 100 to 330 gausses to a portion 10 to 30 mm under the shower plate 6 in the etching processing chamber 1, thereby generating an ECR resonance plasma in the etching processing chamber 1. The number of turns of the conductor of each of the solenoidal coils is 1200 turns.

A matter to be treated 3 is placed on a processing stage 2 which is then etch processed by the plasma generated. The etching gas is introduced through a gas flow rate controller 8 into the etching processing chamber 1, and then is exhausted through an exhausting valve 17 to the outside of the etching processing chamber 1 by a vacuum pump. The processing stage 2 having placed thereon the matter to be treated 3 is connected to a high frequency power supply 5. The power supply 5 applies thereto a high frequency bias voltage having a frequency in a range from 400 kHz to 13.56 MHz. The processing stage 2 can be fixed at an arbitrary distance in the permissible range of the apparatus from the lower surface of the shower plate 6 disposed opposite to the top surface of the processing stage 2.

The diameter of the antenna 9 is about 250 mm. An antenna dielectric (made of alumina) 13 having a thickness of about 20 mm is provided on the lower surface of the antenna 9. An outer circumference portion 15 of the etching apparatus consisting of a non-magnetic metal and grounded to a grounding potential is provided on the further lower surface.

In FIG. 1, of reference numerals not used in the description described above, the numeral 4 denotes a susceptor, the numeral 7 denotes a conductance valve, the numeral 10 denotes a UHF wave matching device, the numeral 14 denotes a siliceous inner tube, the numeral 16 denotes a gate valve for carrying a wafer, and the numeral 21 denotes a yoke.

The 12-inch silicon wafer 3 as the matter to be treated is carried into the processing chamber 1, and then is placed on the processing stage 2. On the silicon wafer 3, there are laminated a silicon oxide film having a thickness of about 500 nm, a lower TiN film having a thickness of about 100 nm, an Al—Cu—Si alloy film having a thickness of about 400 nm, an upper TiN film having a thickness of about 100 nm, and a photoresist mask provided by transferring a mask pattern of 700 nm. The pattern width of the photoresist mask is 200 nm.

The wafer 3 is placed on the processing stage 2, a chlorine gas of 200 sccm, a boron trichloride gas of 40 sccm, and a methane gas of 7 sccm are introduced, as the etching gas, into the etching apparatus, so that the total gas pressure is 1 Pa, thereby etching together the TiN films and Al—Cu—Si alloy film. The temperature of the processing stage 2 during etching is set to 40° C., the frequency of the UHF wave introduced is 450 MHz, and the introduction power is 1400W. The frequency of the high frequency bias voltage supplied through the processing stage 2 to the wafer 3 is 800 kHz, and the supply power is 200W (about 0.3W/cm²).

When the coil currents of the coils 18, 19 and 20 are set to 5A, 4A and 1A, respectively, the equal magnetic field plane of 160 gausses is almost flat. Under the conditions, the average ion current density is 2.0 mA/cm² on the wafer 3, 2.5 mA/cm² in the peripheral portion of the wafer, and is 1.5 mA/cm² in the center portion thereof. Further, when the coil currents of the coils 18, 19 and 20 are set to 9A, 0A and 0A, respectively, the ion current density distribution is 1.5 mA/cm² in the peripheral portion of the wafer, and 2.5 mA/cm² in the center portion of the wafer.

The coil currents are modulated, and the current of the coil 18 is flowed by repeatedly switching alternately between 5A and 9A, the current of the coil 19 between 4A and 0A, and the current of the coil 20 is between 1A and 0A. The modulation cycle (the repetition cycle) is 0.1 seconds. Under the conditions, the ion current density distribution on the wafer 3 is almost flat.

The plasma density in a space about 20 mm above the wafer 3 is about $2 \times 10^{11}/cm^3$, and is almost uniform with a diameter in the range of 300 mm. The ion flux radiated onto the wafer 3 is also almost uniform in the wafer 3 surface. The multilayer thin film formed on the wafer 3 is etched in that order of the upper TiN layer, the Al—Cu—Si alloy layer, and the lower TiN layer. At this time, the average etching speed of the TiN layer is about 400 nm/min, the average etching speed of the Al—Cu—Si alloy film is about 800 nm/min, and the average etching speed of the photoresist is about 300 nm/min. Variations in the etching speed are about ±2% in the wafer surface, thereby giving sufficient uniformity.

When the modulation cycle (the repetition cycle) of the coil current is one second, almost the same effect as described above can be obtained, and the ion current density will not be changed greatly in one second. This is because the change of the ion current density due to the cyclic change of the plasma can be released by the diffusion process while the ion reaches the wafer 3. When the modulation cycle exceeds 10 seconds, the total amount of the ion radiated onto the wafer 3 is almost uniform in the wafer surface. Since the ion current density is cyclically changed greatly, a part of the semiconductor device on the wafer 3 is destructed.

When the modulation cycle of the coil current is shortened to 0.01 seconds, the coil impedance makes it hard to flow the electric current. The power voltage applied to the coil must be increased by about 20 percent as compared with the modulation cycle of 0.1 seconds. When the modulation cycle is 0.001 seconds, the coil impedance is higher to cut the alternating current component. There occurs the same state as in the case of an average direct current flowed, thereby making it difficult to obtain a sufficient effect.

In the film to be etched, in addition to the above-mentioned films, a poly-Si film, Al—Cu alloy film, W film, WN film, silicon oxide film, and silicon nitride film can provide the same effect. The wafer diameter is not limited to 12 inches, and may be 8 or 16 inches to provide the same effect.

The frequency of the UHF wave applied to the antenna 9 is changed from 450 MHz in the above example to 900 MHz, and corresponding to it, an equal magnetic field plane of 320 gausses is modulated and controlled as described above, thereby providing the same effect. When the frequency of the UHF wave applied is 1 GHz or higher, a node due to the propagation mode of an electromagnetic wave appears and the uniform processing is difficult. On the other hand, when the frequency of the UHF wave applied is lowered to 300 MHz, the same effect can be obtained. When the frequency of the UHF wave applied is further lowered to 200 MHz, the plasma generation efficiency is lowered and a sufficient plasma density is hard to obtain.

EXAMPLE 2

Figure 5:
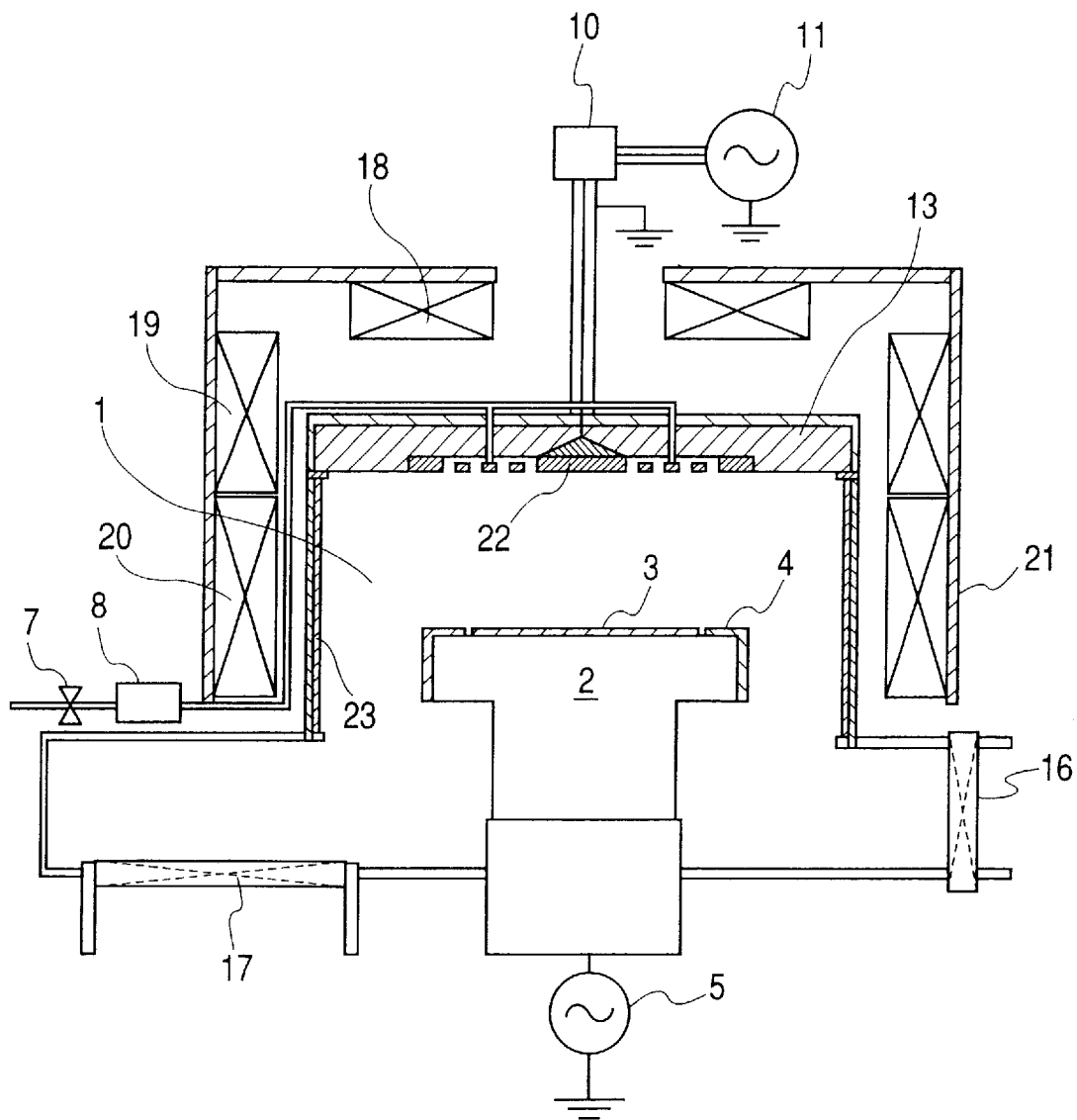
FIGS. 5 and 6 are longitudinal sectional schematic views showing the general construction of a dry etching apparatus of another example of the present invention.

FIG. 5 shows the general construction of a dry etching apparatus of another example of the present invention. The apparatus of this example has the construction of the antenna portion for introducing a UHF wave different from that of the apparatus in FIG. 1. An antenna 22 is provided so as to be exposed to the inner space of the etching processing chamber 1, and the antenna 22 is exposed to a plasma. The numeral 23 denotes a processing chamber inner tube made of SiC sintering material.

The antenna 22 has a construction in which a phosphate-doped silicon disc and an aluminum disc are superposed with each other and has a diameter of about 330 mm. The silicon disc side is exposed to the processing chamber 1. The antenna 22 is also provided with a shower plate.

The 12-inch silicon wafer 3 as the matter to be treated is carried into the processing chamber 1, and then is placed on the processing stage 2. On the silicon wafer 3, there are laminated a silicon nitride film having a thickness of 0.1 mm, an oxide film having a thickness of 1.5 mm, and a photoresist mask provided by transferring a mask pattern. A hole pattern having a diameter of 150 nm is formed on the photoresist mask.

An Ar gas of 500 sccm, a $C_4F_8$ gas of 12 sccm, and an oxygen gas of 8 sccm are introduced into the processing chamber 1, and then the gas pressure in the processing chamber is set to 2 Pa. The antenna 22 introduces a high frequency wave (UHF wave) power of 450 MHz and 2 kW into the processing chamber 1 to generate a gas plasma. A high frequency bias of 2 MHz and 2.4 kW is applied to the processing stage 2 to etching process the oxide film through the photoresist mask. At this time, the plasma density is $5 \times 10^{11}/cm^3$, and the ion current density is about 7 mA/cm².

When the coil currents of the coils 18, 19 and 20 are set to 6A, 3A and 0A, respectively, the equal magnetic field plane is almost flat. Under the conditions, the average ion current density is 7.0 mA/cm² on the wafer 3, 8.0 mA/cm² in the peripheral portion of the wafer, and is 6.0 mA/cm² in the center portion thereof. Further, when the coil currents of the coils 18, 19 and 20 are set to 10A, −1A and 0A, respectively, the ion current density distribution is 6.0 mA/cm² in the peripheral portion of the wafer, and 8.0 mA/cm² in the center portion thereof.

The coil currents are modulated, and the coil currents of the coils 18,19 are flowed by repeatedly switching alternately between 6A and 3A, and between 10A and −1A, respectively. The modulation cycle (the repetition cycle) is 0.1 seconds. Under the conditions, the ion current density distribution on the wafer 3 is almost flat. Under the conditions, the etching speed of the oxide film is about 750 nm/min. The etching selectivity to the photoresist mask is 20, and the etching selectivity to the silicon nitride film thereunder is about 30. Variations in the etching speed of the oxide film in the wafer surface are about ±2%.

In this way, the coil current is modulated to improve the uniformity the etching speed in the wafer surface. The same effect can be obtained in a poly-Si film, Al—Cu—Si film, W film, WN film and silicon nitride film, in addition to the oxide film.

EXAMPLE 3

Figure 6:
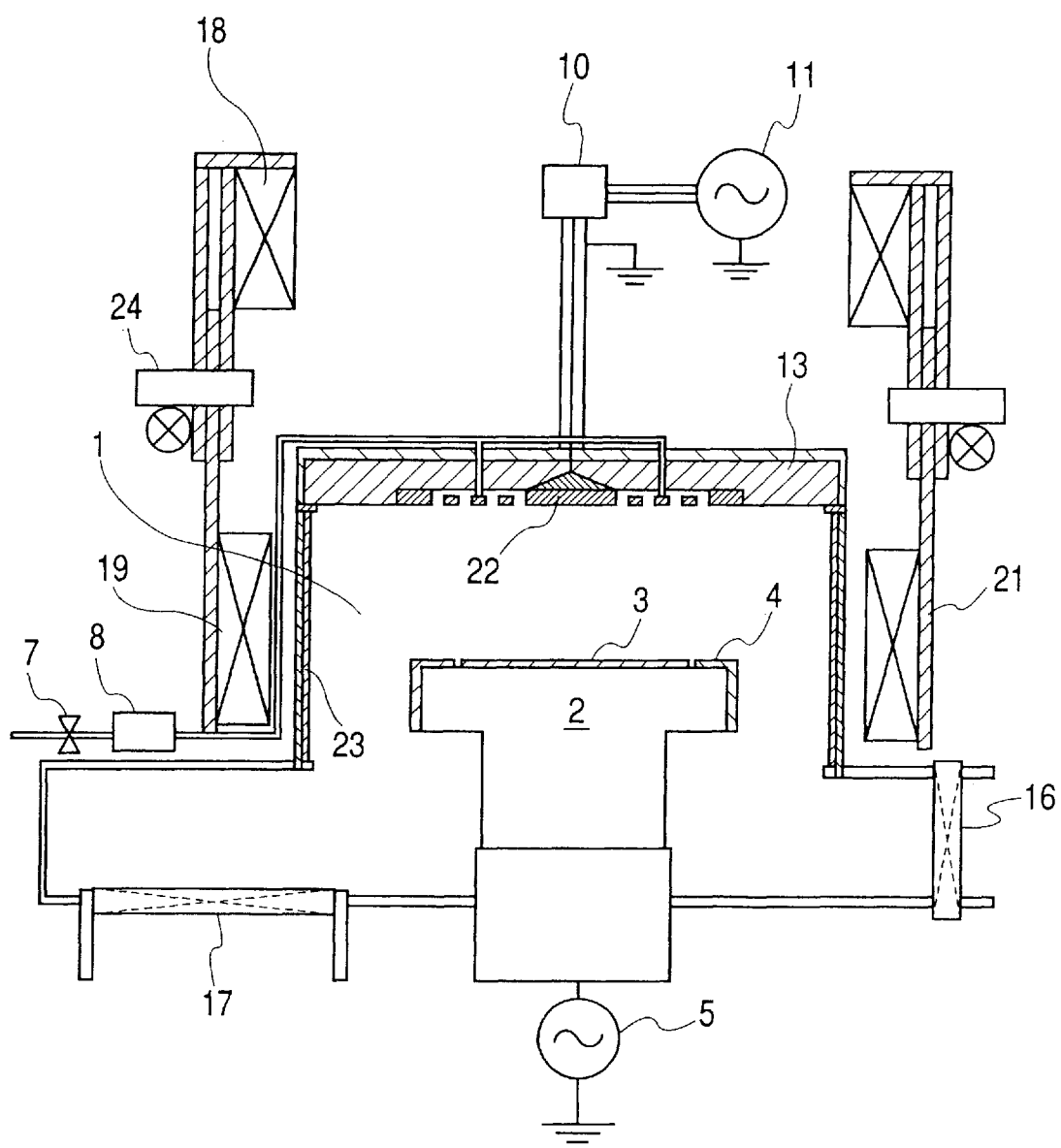

FIG. 6 shows the general construction of a dry etching apparatus of a further example of the present invention. This example employs a method for moving the heightwise position of the coil, as another method for modulating a magnetic filed magnitude. In other words, one coil 18 of two solenoidal coils 18, 19 is moved upward and downward by a position controller 24.

Coil currents of 10A and 5A are flowed to the coils 18, 19, respectively, to move the heightwise position of the coil 18 upward and downward. When the heightwise position of the coil 18 (a distance from the lower end surface of the coil 18 to the inside surface of the processing chamber of the antenna 22) is 100 mm, the ion current density distribution is concave. When the heightwise position of the coil 18 is 200 mm, the ion current density distribution is convex.

The 8-inch silicon wafer 3 as the matter to be treated is carried into the processing chamber 1, and then is placed on the processing stage 2. On the silicon wafer 3, there are formed a silicon nitride film having a thickness of 0.1 mm, an oxide film having a thickness of 1.5 mm, and a photoresist mask provided by transferring a mask pattern. A hole pattern having a diameter of 150 nm is formed on the photoresist mask.

An Ar gas of 500 sccm, a CO gas of 300 sccm, a $C_4F_8$ gas of 15 sccm, and an oxygen gas of 3 sccm are introduced through a gas introduction port into the processing chamber 1, and then the gas pressure in the processing chamber 1 is set to 2 Pa. The antenna 22 introduces a high frequency wave power of 450 MHz and 1.3 kW into the processing chamber 1 to generate a gas plasma. A bias of 3.5 MHz and 1.2 kW is applied to the processing stage 2 to etch process the oxide film. The ion current density is about 6.5 mA/cm².

When the heightwise position of the coil 18 is moved upward and downward between 100 mm and 200 mm with a cycle of once in 3 seconds, the ion current density distribution is almost uniform. The etching speed of the oxide film through the photoresist mask is about 600 nm/min, and the uniformity in the wafer surface is about ±3%.

As is apparent from the detailed description, in the magnetic UHF etching apparatus according to the present invention, the coil current flowed to the solenoidal coil as the magnetic field applying means is changed cyclically, so that a high-density plasma at a low gas pressure can be generated uniformly and stably in a large-diameter wafer surface. The etching apparatus with the antenna construction is used to perform etch processing a fine pattern having a line width of 200 nm or below uniformly over the entire surface of a wafer having a large diameter of 12 inches or more. Thus, a semiconductor device having a higher integration density can be manufactured.

INDUSTRIAL APPLICABILITY

The dry etching apparatus and the dry etching method according to the present invention can uniformly form an extremely fine pattern over the entire surface of a semiconductor wafer having a large diameter. Thus, the dry etching apparatus and the dry etching method according to the present invention can be efficiently used in a process for manufacturing a semiconductor device having a high integration density.

What is claimed is:

1. A dry etching apparatus comprising means for introducing at least one processing gas into a vacuum processing chamber, exhausting means for exhausting the processing gas to the outside of the vacuum processing chamber, a plate antenna capable of applying a high frequency voltage to the upper portion in the vacuum processing chamber and a plurality of solenoidal coils disposed outside of the vacuum processing chamber, wherein a plasma is generated in the vacuum processing chamber, and the plasma generated is used to etch process a substrate to be treated placed in the vacuum processing chamber, further comprising modulator for coil current for cyclically modulating a coil current flowing to the solenoidal coil.

2. The dry etching apparatus according to claim 1, wherein the modulation cycle of the coil current of the modulator for coil current is set to 10 seconds or below.

3. A dry etching apparatus comprising means for introducing at least one processing gas into a vacuum processing chamber, exhausting means for exhausting the processing gas to the outside of the vacuum processing chamber, a plate antenna capable of applying a high frequency voltage to the upper portion in the vacuum processing chamber and a plurality of solenoidal coils disposed outside of the vacuum processing chamber, wherein a plasma is generated in the vacuum processing chamber, and the plasma generated is used to etch process a substrate to be treated placed in the vacuum processing chamber, further comprising coil position control means for cyclically changing the upward and downward position of at least one solenoidal coil of the plurality of solenoidal coils.

4. The dry etching apparatus according to claim 2 or 3, wherein the frequency of the high frequency voltage applied to the plate antenna is set in a range from 300 MHz to 900 MHz.

5. A dry etching method comprising using a dry etching apparatus including a vacuum processing chamber, vacuum exhausting means for vacuum exhaustion in the vacuum processing chamber, gas introducing means for introducing a gas for etch processing into the vacuum processing chamber, plasma generating generating means for forming the introduced gas in plasma in the vacuum processing chamber, and magnetic field applying means for applying magnetic field into the vacuum processing chamber, and etch processing a substrate to be treated placed in the vacuum processing chamber, wherein the magnitude of the magnetic field applied by the magnetic field applying means is modulated cyclically when the substrate to be treated is etch processed.

6. The dry etching apparatus according to claim 5, wherein the cycle of the cyclic modulation of the magnitude of the magnetic field applied by the magnetic field applying means is set to 10 seconds or below.

7. A dry etching apparatus comprising:
gas introducing means for introducing at least one processing gas into a vacuum processing chamber;
exhausting means for exhausting the processing gas to outside of the vacuum processing chamber;
a plate antenna capable of applying a high frequency voltage to an upper portion in the vacuum processing chamber; and
a plurality of solenoidal coils disposed outside of the vacuum processing chamber;
wherein a plasma is generated in the vacuum processing chamber, and the plasma generated is used to etch process a substrate to be treated placed in the vacuum processing chamber; and
further comprising:
a modulator for cyclically modulating a coil current flowing to at least one of the solenoidal coils;
wherein the plate antenna generates an electric field having a horizontal component, and the at least one of the solenoidal coils generates a magnetic field vector in a vertical direction.

8. The dry etching apparatus according to claim 7, wherein the modulation cycle of the coil current of the modulator is set to 10 seconds or below.

9. A dry etching apparatus comprising:
gas introducing means for introducing at least one processing gas into a vacuum processing chamber;
exhausting means for exhausting the processing gas to outside of the vacuum processing chamber;
a plate antenna capable of applying a high frequency voltage to an upper portion in the vacuum processing chamber; and
a plurality of solenoidal coils disposed outside of the vacuum processing chamber;
wherein a plasma is generated in the vacuum processing chamber, and the plasma generated is used to etch process a substrate to be treated placed in the vacuum processing chamber;
further comprising:
coil position control means for cyclically changing an upward and downward position of at least one solenoidal coil of the plurality of solenoidal coils;
wherein the plate antenna generates an electric field having a horizontal component, and the at least one solenoidal coil generates a magnetic field vector in the vertical direction.

10. The dry etching apparatus according to claim 8 or 9, wherein the frequency of the high frequency voltage is set in a range from 300 MHz to 900 MHz.

11. A dry etching method comprising the steps of:
using a dry etching apparatus including a vacuum processing chamber, vacuum exhausting means for vacuum exhaustion in the vacuum processing chamber, gas introducing means for introducing a gas for etch processing into the vacuum processing chamber, plasma generating means for forming a plasma within the vacuum processing chamber, and magnetic field applying means for applying a magnetic field into the vacuum processing chamber; and
etch processing a substrate to be treated placed within the vacuum processing chamber; and
further comprising the steps of:
using a plate antenna to generate an electric field having a horizontal component;
using a solenoidal coil to generate a magnetic field vector in a vertical direction; and
cyclically modulating a magnitude of the magnetic field applied by the magnetic field applying means when the substrate to be treated is etch processed.

12. The dry etching method according to claim 11, wherein the cycle of the cyclic modulation of the magnitude of the magnetic field applied by the magnetic field applying means is set to 10 seconds or below.

* * * * *